US009070742B2

(12) United States Patent
Xie et al.

(10) Patent No.: US 9,070,742 B2
(45) Date of Patent: Jun. 30, 2015

(54) FINFET INTEGRATED CIRCUITS WITH UNIFORM FIN HEIGHT AND METHODS FOR FABRICATING THE SAME

(71) Applicant: GLOBALFOUNDRIES Inc., Grand Cayman, KY (US)

(72) Inventors: Ruilong Xie, Albany, NY (US); Xiuyu Cai, Niskayuna, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 156 days.

(21) Appl. No.: 13/745,547

(22) Filed: Jan. 18, 2013

(65) Prior Publication Data

US 2014/0203376 A1 Jul. 24, 2014

(51) Int. Cl.
 H01L 21/70 (2006.01)
 H01L 27/088 (2006.01)
 H01L 21/336 (2006.01)
 H01L 21/8234 (2006.01)
 H01L 21/76 (2006.01)
 H01L 21/762 (2006.01)
 H01L 29/78 (2006.01)
 H01L 29/66 (2006.01)

(52) U.S. Cl.
 CPC ........ *H01L 21/76224* (2013.01); *H01L 29/785* (2013.01); *H01L 29/7851* (2013.01); *H01L 27/0886* (2013.01); *H01L 21/823431* (2013.01); *H01L 29/66795* (2013.01)

(58) Field of Classification Search
 CPC .................. H01L 21/76224; H01L 29/66795; H01L 29/785; H01L 29/7851; H01L 21/823431; H01L 27/0886
 USPC ........... 257/368, 401; 438/283, 197, 424, 296
 See application file for complete search history.

(56) References Cited

U.S. PATENT DOCUMENTS

| 2002/0197823 | A1* | 12/2002 | Yoo et al. ................. 438/424 |
| 2004/0150029 | A1* | 8/2004 | Lee ........................... 257/308 |
| 2006/0118876 | A1* | 6/2006 | Lee et al. ................... 257/365 |
| 2006/0134868 | A1* | 6/2006 | Yoon et al. ................ 438/283 |
| 2009/0111239 | A1* | 4/2009 | Kim .......................... 438/426 |
| 2010/0193708 | A1* | 8/2010 | Tabat et al. ............. 250/492.3 |
| 2014/0070328 | A1* | 3/2014 | Goto et al. ................. 257/401 |

* cited by examiner

Primary Examiner — Fernando L Toledo
Assistant Examiner — Aaron Gray
(74) Attorney, Agent, or Firm — Ingrassia Fisher & Lorenz, P.C.

(57) ABSTRACT

Methods for fabricating FinFET integrated circuits with uniform fin height and ICs fabricated from such methods are provided. A method includes etching a substrate using an etch mask to form fins. A first oxide is formed between the fins. A first etch stop is deposited on the first oxide. A second oxide is formed on the first etch stop. A second etch stop is deposited on the second oxide. A third oxide is deposited overlying the second etch stop. An STI extends from at least a surface of the substrate to at least a surface of the second etch stop overlying the fins to form a first active region and a second active region. The first etch stop overlying the fins is removed. The third oxide is removed to expose the second etch stop. A gate stack is formed overlying a portion of each of the fins.

18 Claims, 15 Drawing Sheets

FINFET INTEGRATED CIRCUITS WITH UNIFORM FIN HEIGHT AND METHODS FOR FABRICATING THE SAME

TECHNICAL FIELD

The technical field generally relates to FinFET integrated circuits and methods for fabricating FinFET integrated circuits, and more particularly relates to FinFET integrated circuits with uniform fin height and methods for fabricating FinFET integrated circuits with uniform fin height.

BACKGROUND

To improve the operating speed of field effect transistors (FETs), and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3-D) structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects. When an appropriate voltage is applied to the gate electrode of a FinFET device, the surfaces (and the inner portion near the surface) of the fins, i.e., the substantially vertically oriented sidewalls and the top upper surface of the fin with inversion carriers, contributes to current conduction. In a FinFET device, the "channel-width" is approximately two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly stronger drive currents than planar transistor devices. Additionally, the leakage current of FinFET devices after the device is turned "OFF" is significantly reduced as compared to the leakage current of planar FETs due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

The fabrication of FinFET ICs, however, encounters some processing issues. FIG. 1 illustrates, in cross section, a portion of a FinFET IC 10 of the prior art taken along an X-X' and a Z-Z' axis. FIG. 2 shows the relationship of the X-X' and Z-Z' axis to each other with respect to the FinFET IC 10. In FIG. 1, FinFET IC 10 is covered by an interlayer dielectric layer 40 while, for ease of illustration, in FIG. 2 it is not and only two fins 14 are shown. Referring to FIG. 1, FinFET IC 10 is fabricated in and on a bulk semiconductor substrate 12 from which a plurality of fins 14 have been etched. A local isolation oxide 16 is disposed between the fins 14 and has a height, as indicated by double-headed arrow 18, as measured from the semiconductor substrate 12 that is less than a height, as indicated by double-headed arrow 20, of the fins 14 as measured from the semiconductor substrate. One challenge is the formation of the local isolation layer 16 between the fins 14 that enables a uniform fin height, as indicated by double-headed arrow 22, between a top surface of the local isolation layer 16 and a top surface of the fins 14 after all fin etch, local isolation, deep trench isolation, implantation patterning, and spacer formation processes are performed before epitaxial formation. A non-uniform fin height results in non-uniform epitaxial growth of silicon-comprising material on the fins before formation of contacts 34. This non-uniform epitaxial growth results in non-uniform contact resistance between the contacts and the fins. Another challenge is to control the fin height 22 underlying a gate stack 36. Particularly during replacement gate flow where dummy oxide is removed from the gate by a diluted hydrofluoric acid wet process, the local oxide isolation could be etched as well as result in non-uniform FIN height. A non-uniform fin height underlying the gate stack 36 results in non-uniform channel widths. Yet a further challenge is control of epitaxial growth on the fins 14 so that lateral epitaxial growth does not cause shorts between adjacent active regions 30 and 32. While deep and wide shallow trench isolation regions 24 may prevent such lateral growth, they do so at the cost of valuable chip real estate.

Accordingly, it is desirable to provide methods for fabricating FinFET integrated circuits that provide for uniform fin height. In addition, it is desirable to provide methods for fabricating FinFET integrated circuits that control epitaxial growth on the fins so that lateral epitaxial growth between active regions does not result in shorts between adjacent devices. It is also desirable to provide FinFET integrated circuits formed from such methods. Furthermore, other desirable features and characteristics of the present invention will become apparent from the subsequent detailed description of the invention and the appended claims, taken in conjunction with the accompanying drawings and this background of the invention.

BRIEF SUMMARY

Methods for fabricating FinFET integrated circuits with uniform fin height and FinFET integrated circuits fabricated from such methods are provided. In accordance with one embodiment, a method includes etching a bulk semiconductor substrate of a first silicon-comprising material using an etch mask to form a plurality of fins. A first oxide is formed between the fins. The first oxide has a height measured from the bulk semiconductor substrate less than a height of the fins measured from the bulk semiconductor substrate. A first etch stop layer is deposited on the first oxide and overlying the plurality of fins. A second oxide is formed on the first etch stop layer. A second etch stop layer is deposited on the second oxide and overlying the fins. A third oxide is deposited overlying the second etch stop layer. A shallow trench isolation is formed that extends from at least a surface of the bulk semiconductor substrate to at least a surface of the second etch stop layer overlying the fins to form a first active region and a second active region is formed. The first etch stop layer overlying the fins of the first active region and the second active region is removed. The third oxide is removed to expose the second etch stop layer overlying the second oxide of the first active region and the second active region. A gate stack is formed extending from the first active region to the second active region and overlying a portion of each of the fins.

In accordance with another exemplary embodiment, a method for fabricating a FINFET integrated circuit includes etching a bulk semiconductor substrate of a first silicon-comprising material to form a plurality of fins. A first oxide is formed between the fins. The first oxide has a height measured from the bulk semiconductor substrate less than a height of the fins measured from the bulk semiconductor substrate. A first etch stop layer is deposited on the first oxide and a second oxide is formed on the first etch stop layer. A second etch stop layer is deposited on the second oxide. A gate stack is formed overlying a portion of each of the fins and a first portion of the second etch stop layer. A second portion of the second etch stop layer is removed using reactive ion etching. A remaining portion of the fins is cleaned and the second oxide is removed. A second silicon-comprising material is epitaxially grown overlying the remaining portion of the fins. Contacts are formed on the second silicon-comprising material.

A FINFET integrated circuit in accordance with an exemplary embodiment includes a bulk semiconductor substrate of a silicon-comprising material and a plurality of fins integral with the bulk semiconductor substrate and of the silicon-comprising material. A first oxide is between adjacent fins and has a height measured from the bulk semiconductor substrate that is less than a height of the fins. A first etch stop layer is on the first oxide, a second oxide is on the first etch stop layer, and a second etch stop layer is on the second oxide. A gate stack overlies the second etch stop layer and the fins.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

Various embodiments for methods of fabricating FinFET integrated circuits and FinFET integrated circuits made from such methods are provided herein. The methods utilize etch stop layers overlying a local isolation layer between the fins to maintain uniform fin height that ultimately controls the channel length and the resistance uniformity of the source and drain contacts. In addition, the methods use the etch stop layers to achieve shallow trench isolation (STI) that prevents lateral epitaxial growth on the fins that can result in shorting between adjacent devices. This in turn permits the design of narrower STI, thus providing additional substrate real estate for design flexibility.

FIGS. 3-15 illustrate methods for fabricating a FinFET integrated circuit 50 in accordance with various embodiments. Various steps in the fabrication of FinFET semiconductor integrated circuits are well known and so, in the interests of brevity, many conventional fabrication steps will only be mentioned briefly herein or will be omitted entirely without providing the well-known process details.

Figure 1:
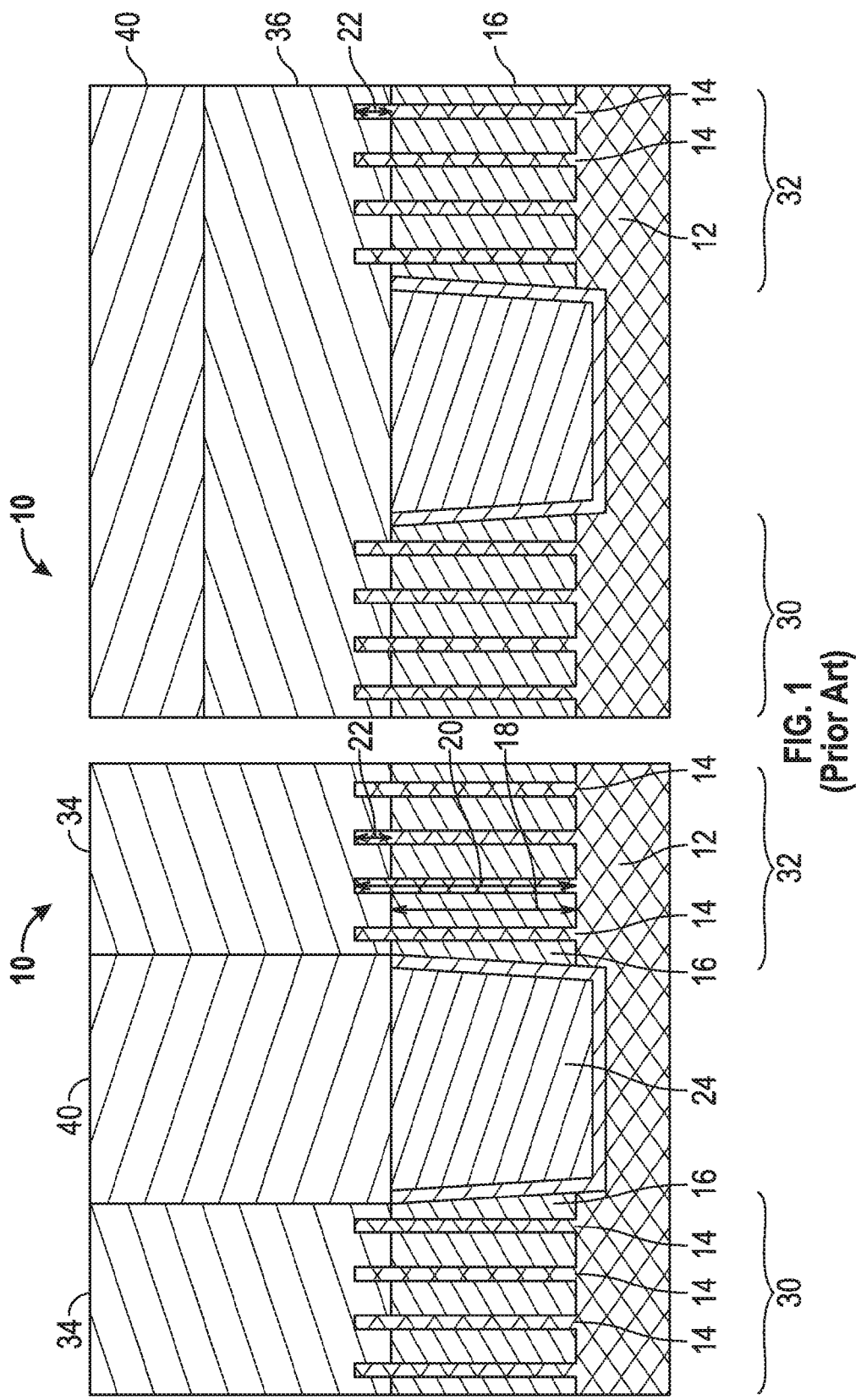
FIG. 1 includes two cross-sectional views taken along an X-X' axis and a Z-Z' axis of a portion a FinFET integrated circuit of the prior art.
Figure 2:
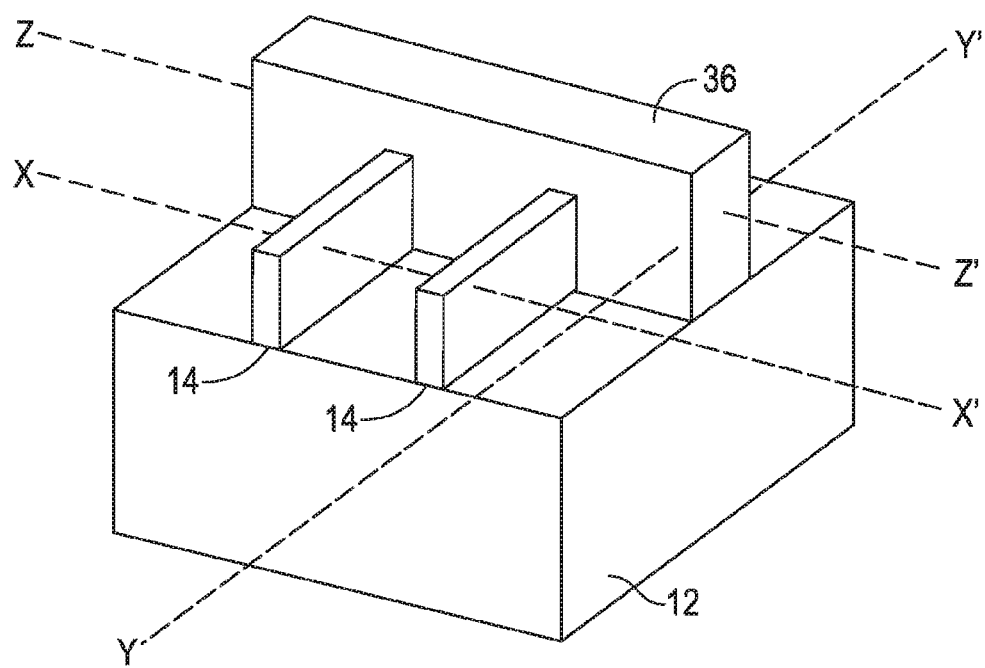
FIG. 2 is a schematic diagram of a portion of the FinFET integrated circuit of FIG. 1 showing the relationship of axis X-X' and Z-Z'.
Figure 3:
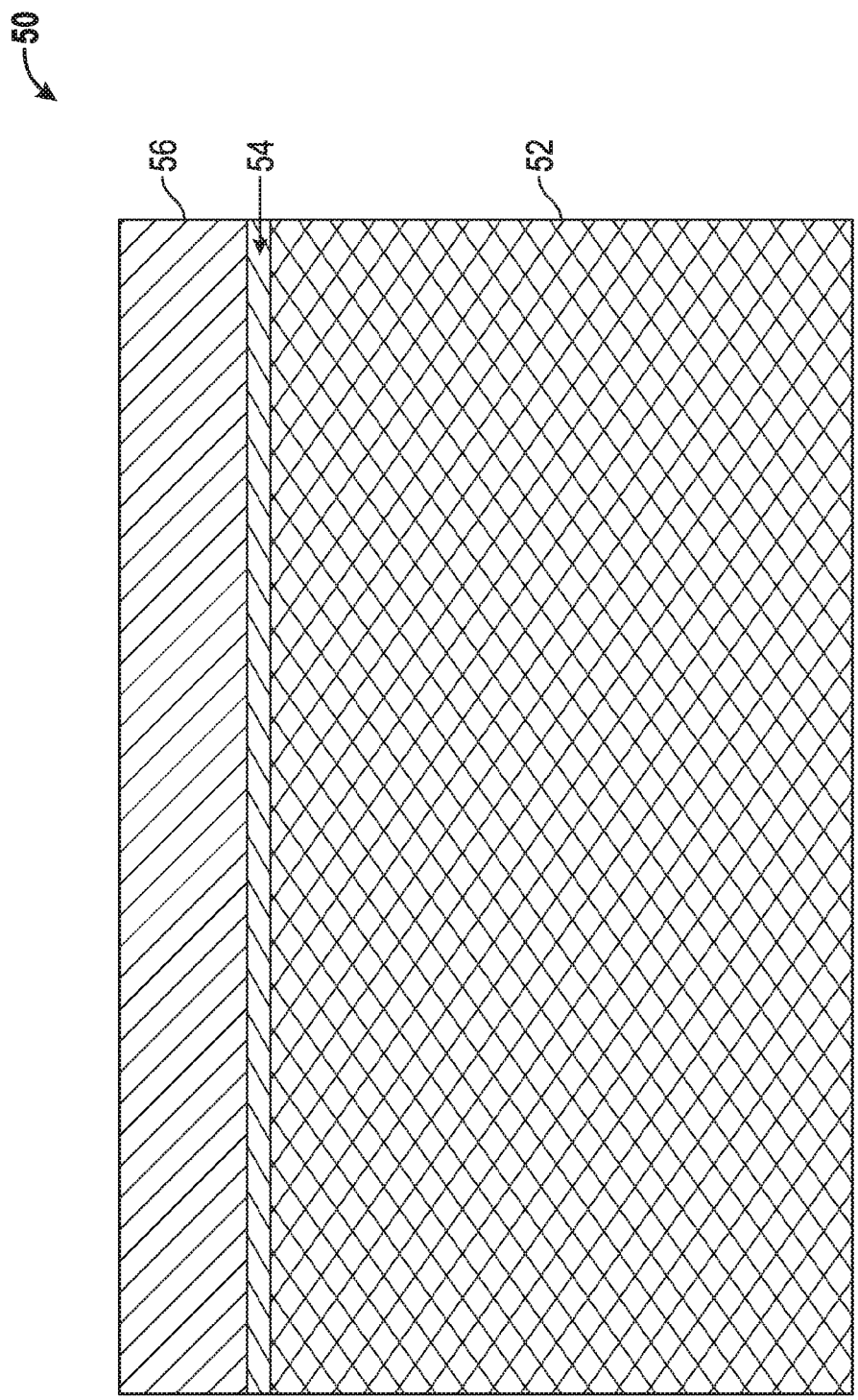
FIG. 3-15 schematically illustrate, in cross section, method steps, in accordance with various embodiments, for fabricating an exemplary FinFET integrated circuit.

FIG. 3 illustrates, in cross section, a portion of FinFET IC 50 at an early stage of fabrication in accordance with one embodiment. IC 50 is fabricated in and on a bulk semiconductor substrate 52. Semiconductor substrate 52 can be, for example, a wafer of silicon, silicon admixed with germanium or other elements, or other semiconductor material commonly used in the fabrication of ICs. Although not illustrated, n-type and p-type wells can be formed in semiconductor substrate 52, for example by the implantation of dopant ions, to form regions in which P-channel and N-channel FETs (PFETs and NFETs, respectively) will be formed. A layer of silicon oxide or other hard mask material 54 is deposited on the semiconductor substrate, and a layer 56 of silicon nitride or other additional hard mask material (having an etch rate that is different than the silicon oxide layer 54) is deposited on the silicon oxide layer 54. In an embodiment, the silicon oxide layer is deposited to a thickness in the range of from about 5 to about 10 nm. The silicon nitride layer can have a thickness in the range of from about 20 to about 50 nm.

Figure 4:
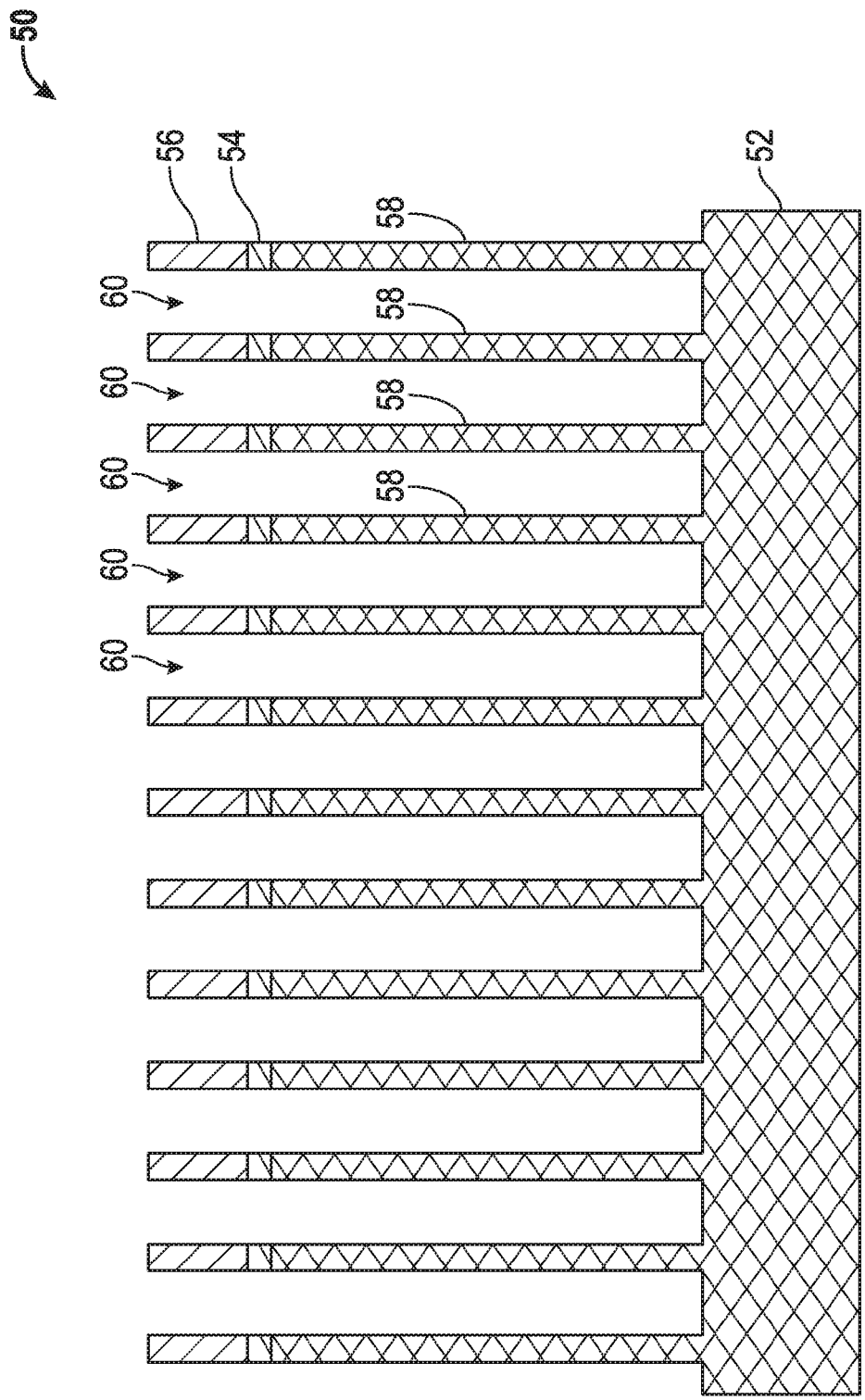

The method for fabricating FinFET IC 50 continues, in accordance with an embodiment, as illustrated in FIG. 4. The silicon nitride hard mask layer 56 is patterned photolithographically. The etched silicon nitride hard mask layer 56 is used as an etch mask to etch oxide layer 54 and deep trenches 60 into the semiconductor substrate 52 to form a plurality of fins 58 integral with and extending upwardly from the semiconductor substrate 52.

Figure 5:
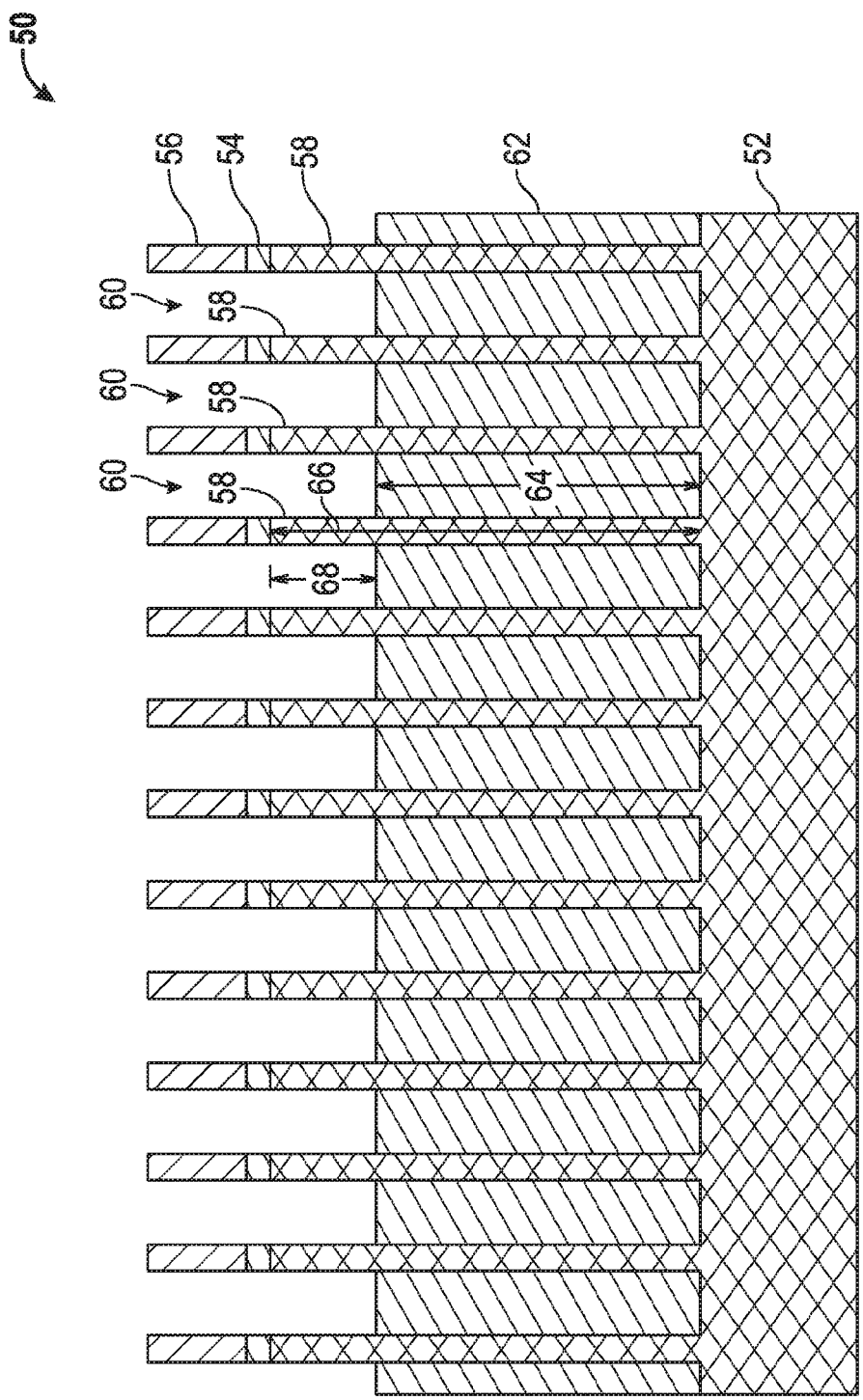

Referring to FIG. 5, in an embodiment, after formation of fins 58, the trenches 60 are filled with an oxide 62, often referred to as a local isolation layer. In one embodiment, because the aspect ratio of the trenches is high, the oxide is a flowable oxide deposited by chemical vapor deposition (CVD). In another embodiment, the oxide is deposited by using a bottom-up process. In an alternative embodiment, the oxide is deposited to overfill, followed by chemical mechanical planarization (CMP) to expose the silicon nitride hard mask layer 56 and etching back of the flowable oxide using diluted hydrofluoric acid as shown. The oxide 62 has a height as measured from the semiconductor substrate, indicated by double-headed arrow 64, that is less than a height as measured from the semiconductor substrate, indicated by double-headed arrow 66, of the fins 58. A fin height, which is defined as the height of the fins above the oxide 62, and as indicated by double-headed arrow 68, is in the range of from about 20 to 50 nanometers (nm), according to an embodiment.

Figure 6:
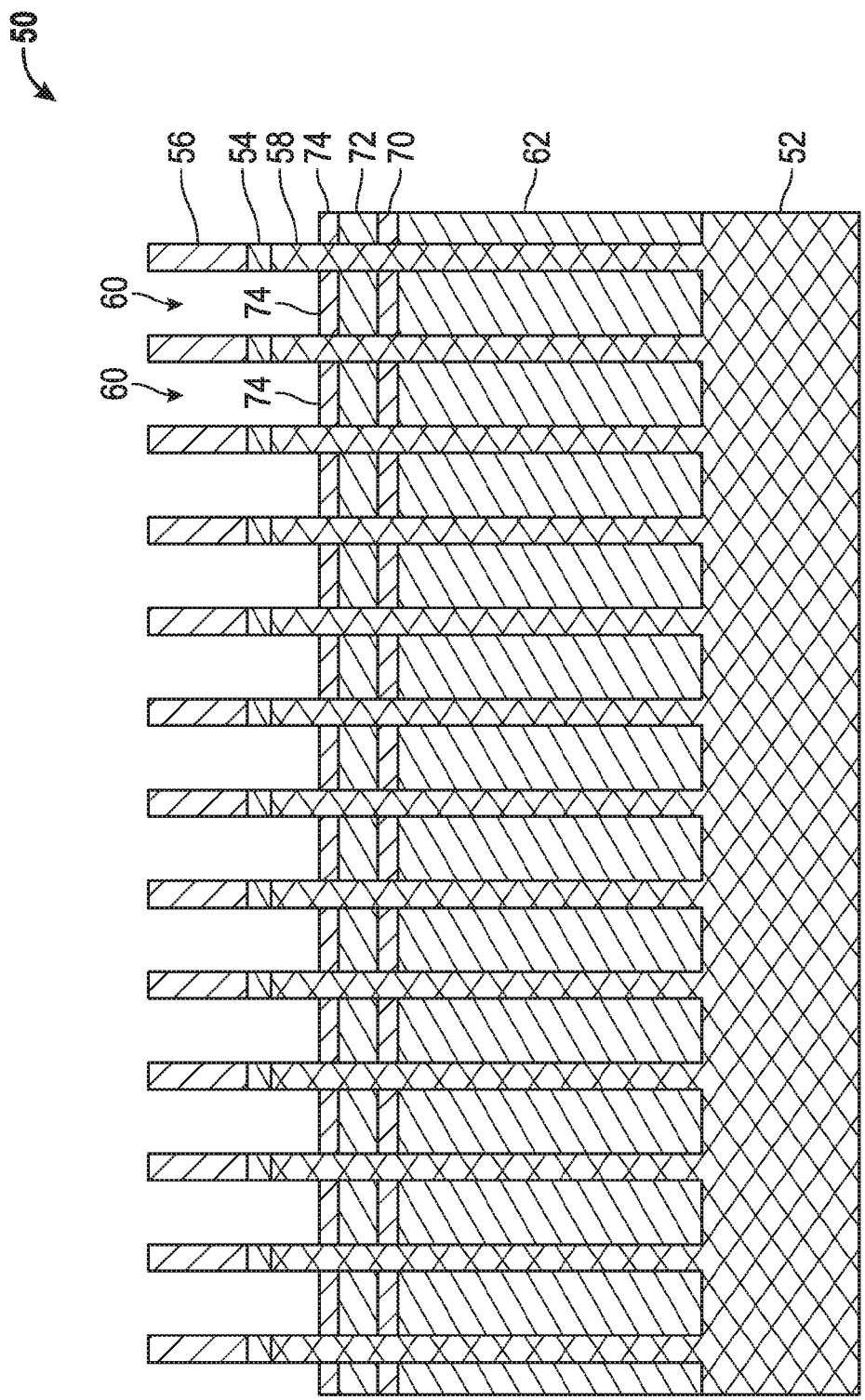

Next, referring to FIG. 6, an etch stop layer 70 is deposited on the oxide/local isolation layer 62 within the trenches 60 and on the silicon nitride hard mask layer 56 overlying fins 58. In an embodiment, the etch stop layer 70 is SiN, and is deposited by gas cluster ion beam (GCIB) processing. In another embodiment, etch stop layer 70 is deposited to a thickness in the range of from about 3 to about 6 nm. An oxide 72 is deposited overlying etch stop layer 70. The oxide 72, for example, is a flowable oxide deposited by chemical vapor deposition (CVD). In one embodiment, the oxide 72 is deposited by using a bottom-up process. In an alternative embodiment, the oxide 72 is deposited to overfill, followed by CMP to expose etch stop layer 70 overlying fins 58 and etching of the flowable oxide by diluted hydrofluoric acid, as shown. The oxide 72 is deposited to a thickness in the range of from about 5 to about 10 nm, in accordance with an embodiment. An etch stop layer 74 then is deposited overlying the oxide 72 within trenches 60 and on etch stop layer 70 overlying fins 58. In an embodiment, the etch stop layer 74 is SiN and is deposited by GCIB processing. In another embodiment, etch stop layer 74 is deposited to a thickness in the range of from about 3 to about 6 nm. For simplicity in the drawings, etch stop layer 70, oxide 72, and etch stop layer 74 are not illustrated overlying silicon hard mask layer 56.

Figure 7:
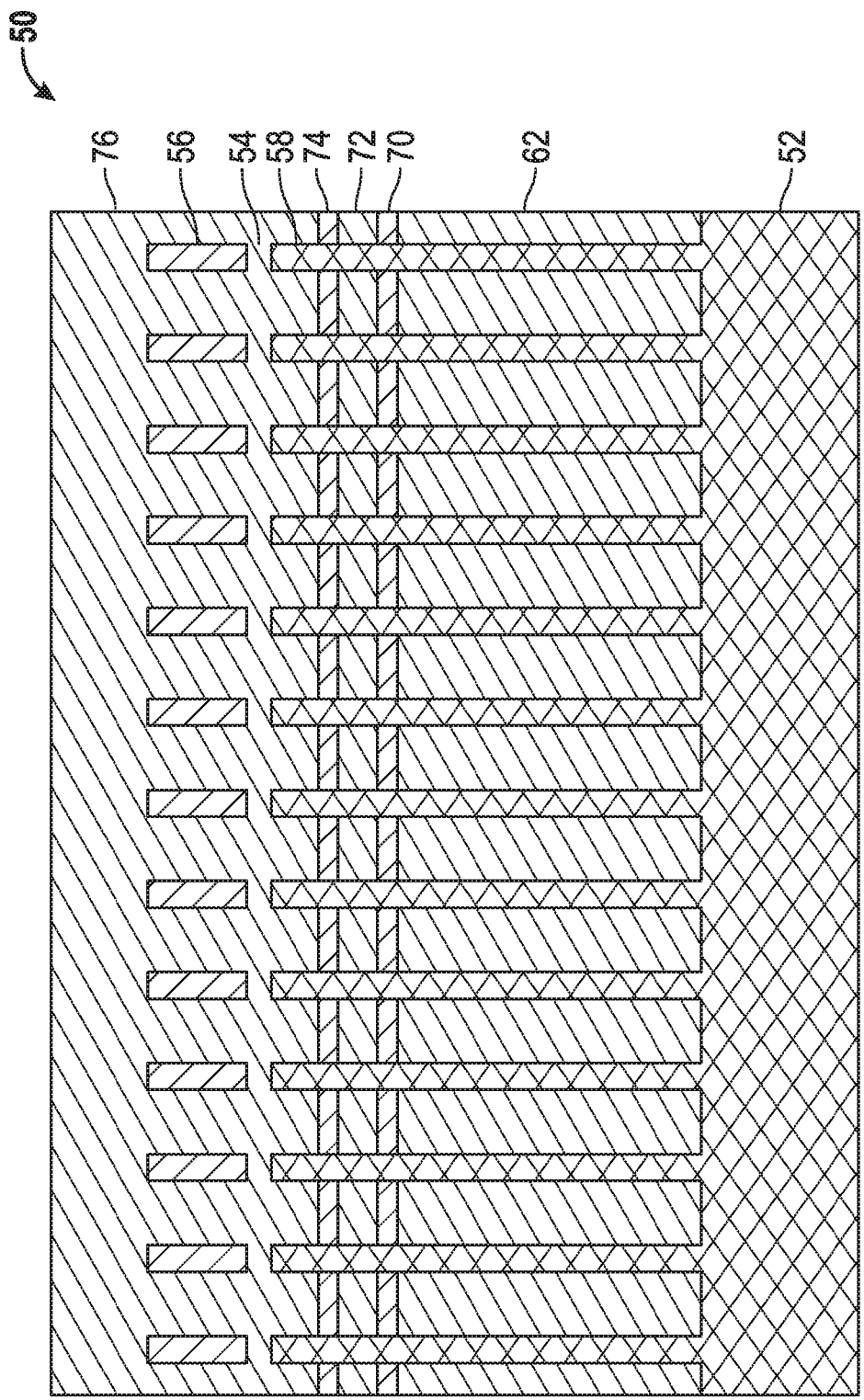

The method for fabricating FinFET IC 50 continues with deposition of an oxide 76 on etch stop layer 74 within and overfilling the trenches 60, as illustrated in FIG. 7. The oxide 76, for example, is a flowable oxide deposited by CVD.

Figure 8:
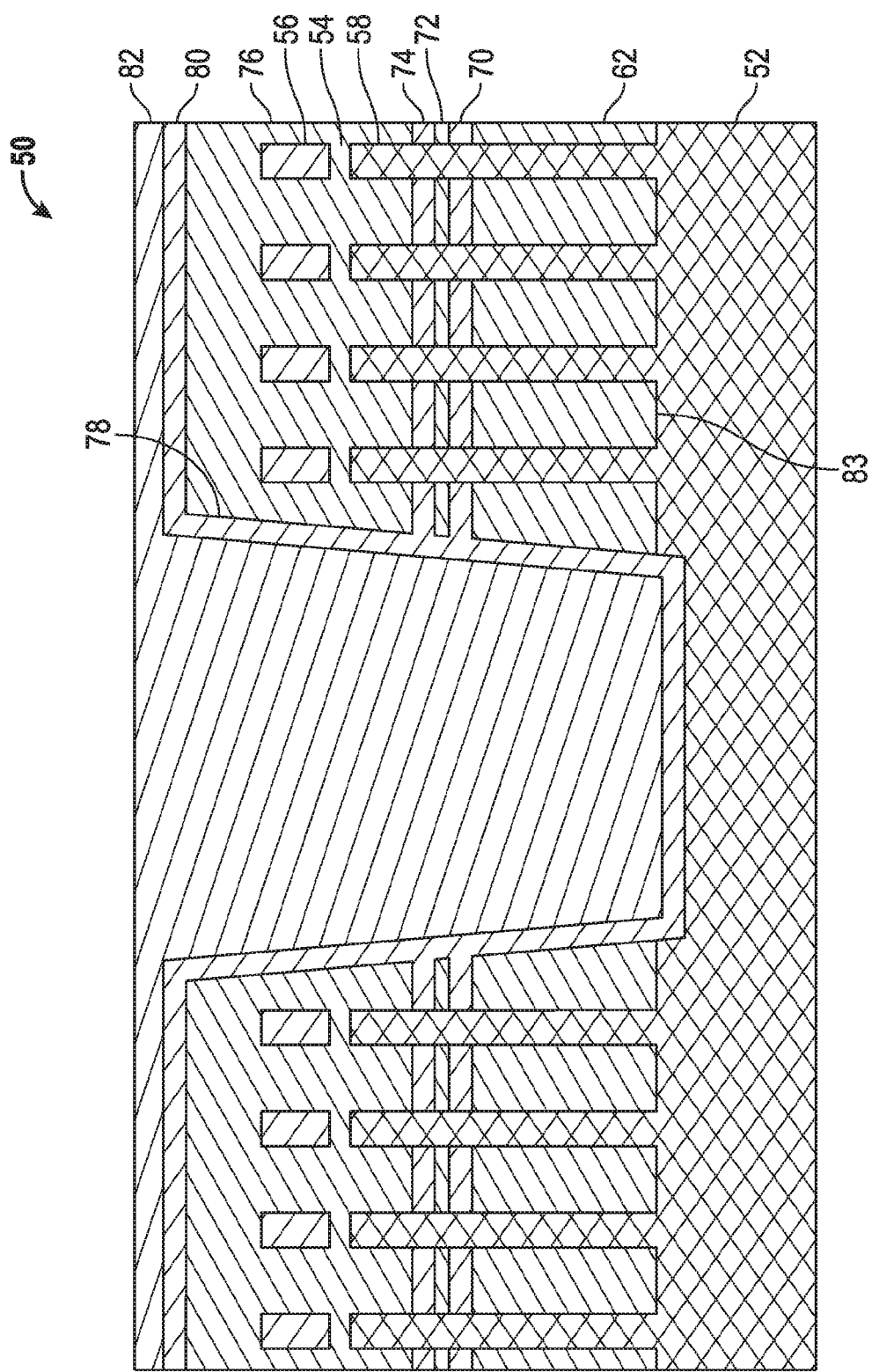
Figure 9:
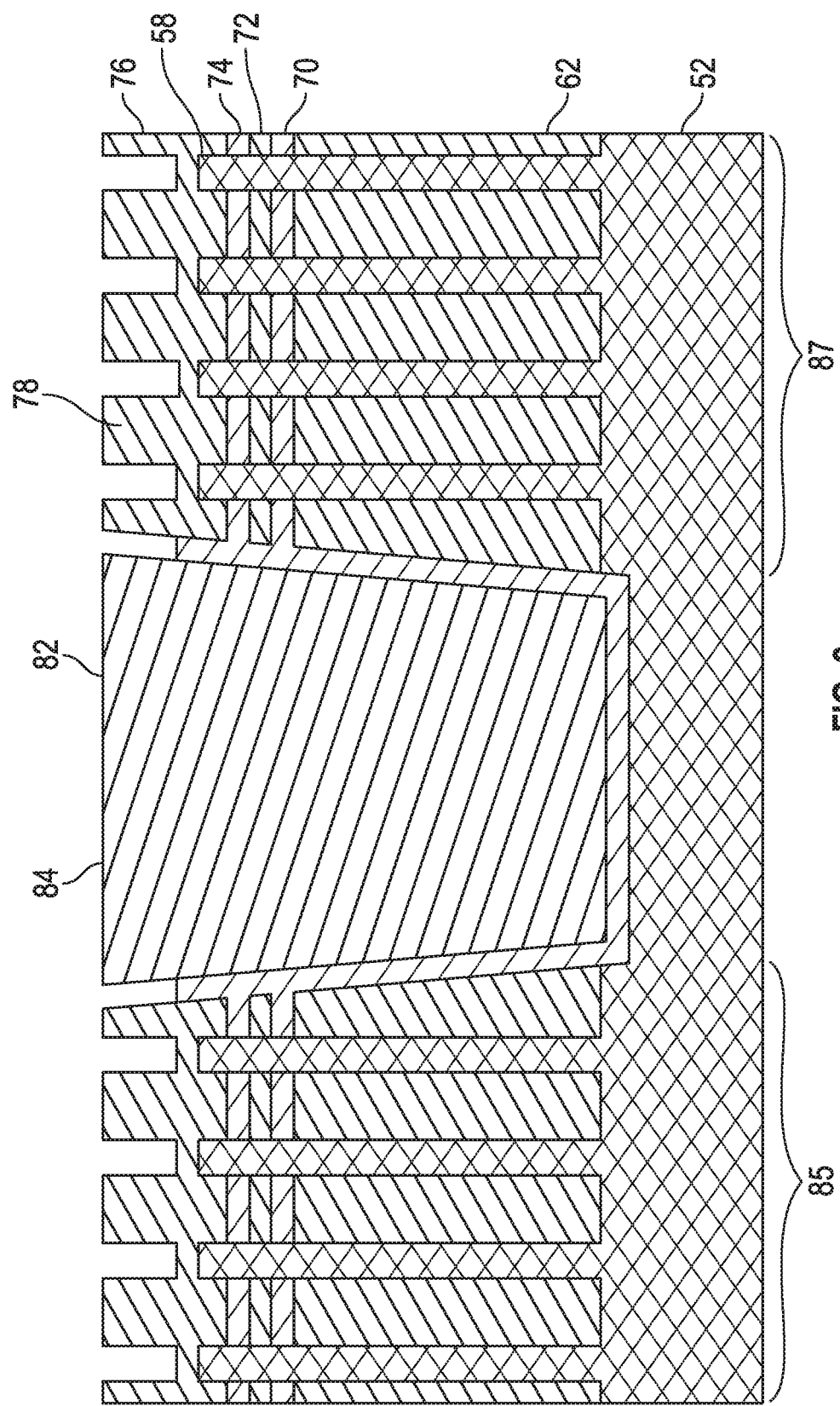

Referring to FIG. 8, after deposition of oxide 76, a trench 78 is etched to or beyond a surface 83 of semiconductor substrate 52. A liner 80 then is formed within the trench 78, in accordance with one embodiment. Suitable materials for liner 80 include, but are not limited to, silicon nitride, silicon oxynitride, hafnium oxide, or the like. The liner can be deposited to a thickness in the range of about 2 to about 6 nm. The trench is filled with oxide 82, such as, for example, a high aspect ratio process (HARP) oxide. A CMP process is performed to remove any overfill of the oxide 82, liner 80, and oxide 76 exposing the etch stop layer 74 overlying the fins 58 to form shallow trench isolation 84 that separates active region 85 and active region 87, as illustrated in FIG. 9. The silicon nitride hard mask layer 56 then is removed such as by, for example, hot phosphoric acid.

Figure 10:
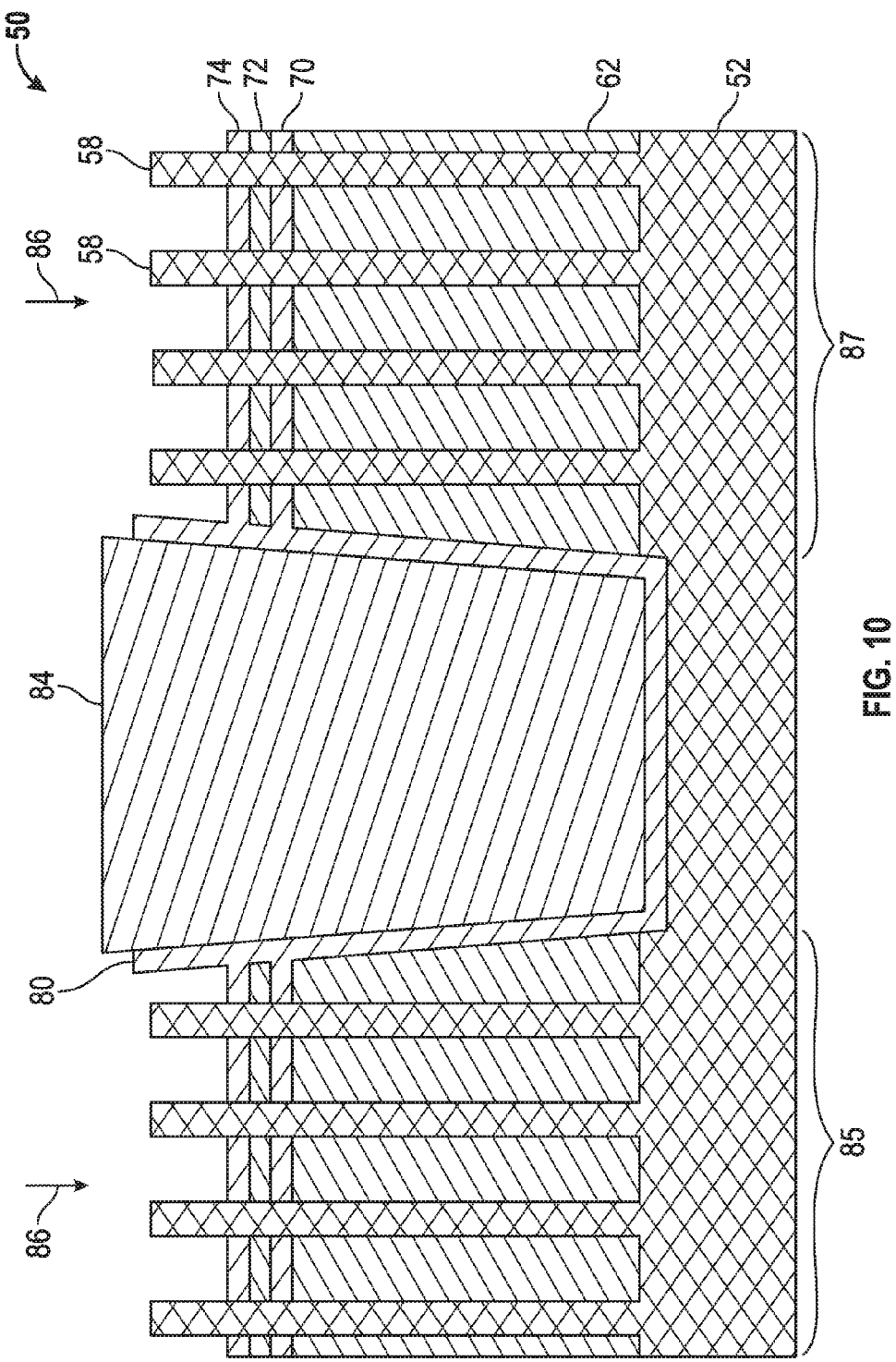

A remaining portion of the oxide 76 is removed, such as by dilute hydrofluoric acid, to expose etch stop layer 74 between the fins 58, as illustrated in FIG. 10. The oxide 82 has a better oxide quality than oxide 76 in terms of wet etch rate and the side wall of the shallow trench isolation 84 is protected by liner 80. Accordingly, the upper surface of the shallow trench isolation 84 is higher than etch stop layer 74. An ion implantation, indicated by arrows 86, then can be performed, for example, to form NFET and PFET wells or for punch-through implantation to suppress short channel effects.

Figure 11:
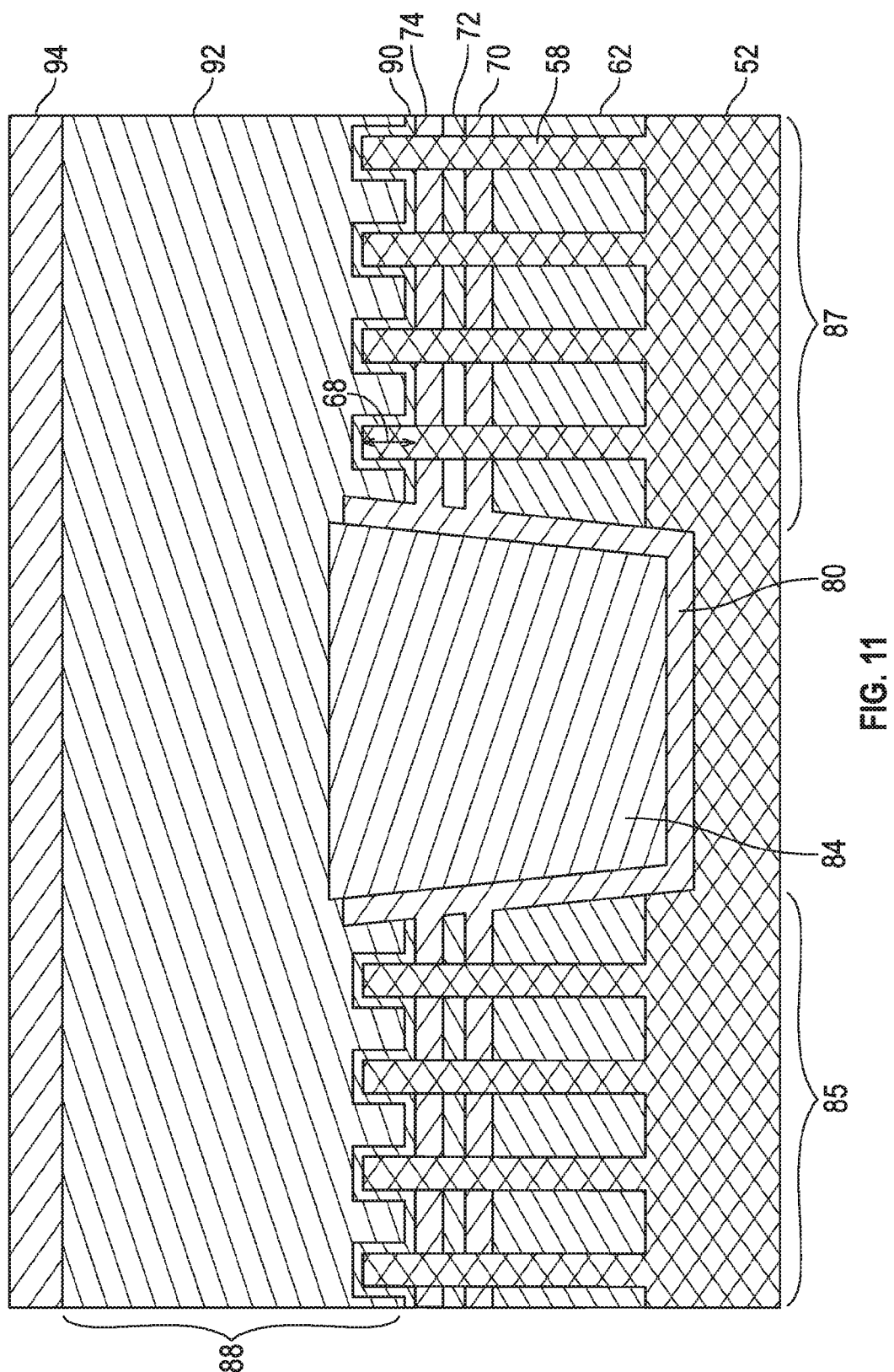
Figure 12:
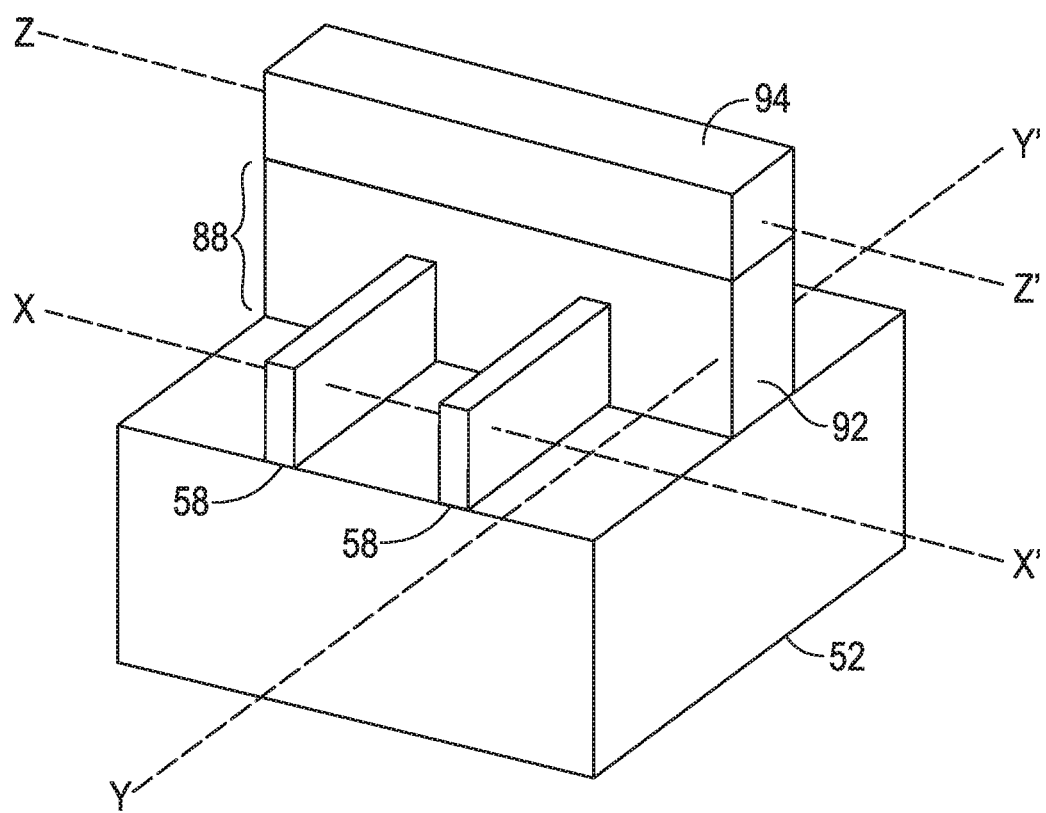

FIG. 11 illustrates the formation of a gate stack 88 overlying fins 58. In one embodiment, the gate stack is a dummy gate stack. In this regard, dummy gate oxide 90 is deposited overlying fins 58 and etch stop layer 74. A dummy gate-forming material 92, such as for example a polycrystalline silicon material, is deposited overlying the oxide 90. In an alternative gate-first process, a gate insulator 90 is deposited overlying fins 58 and etch stop layer 74. The gate insulator 90 can be, for example, a layer of deposited silicon oxide, a layer of high dielectric constant insulating material such as an oxide of hafnium, or a combination of insulating material. A layer of gate electrode material 92 such as polycrystalline silicon, amorphous silicon, or a metal is deposited overlying the gate insulator layer 90. Although not illustrated, additional layers may be deposited between the gate insulating layer and the layer of gate electrode material to set the work function for NFETs and PFETs. As illustrated in FIG. 12 (which for convenience shows only two fins and does not show the STI), the oxide or gate insulator 90 and the dummy gate-forming material or gate electrode material 92 are photolithographically patterned in conventional manner using a hard mask 94 to form a gate stack 88 (or dummy gate stack as the case may be) overlying the fins in a substantially perpendicular manner. As illustrated in FIG. 11, the etch stop layer 74 defines a uniform fin height 68 of fins 58 underlying gate stack 88 and across active regions 85 and 87. As illustrated in FIG. 11, after formation of the gate stack (dummy or otherwise) 88, a portion of each of the fins 58 lying along axis Z-Z' underlies the gate stack 88 and a portion of each of the fins 58 lying along axis X-X' is exposed.

Figure 13:
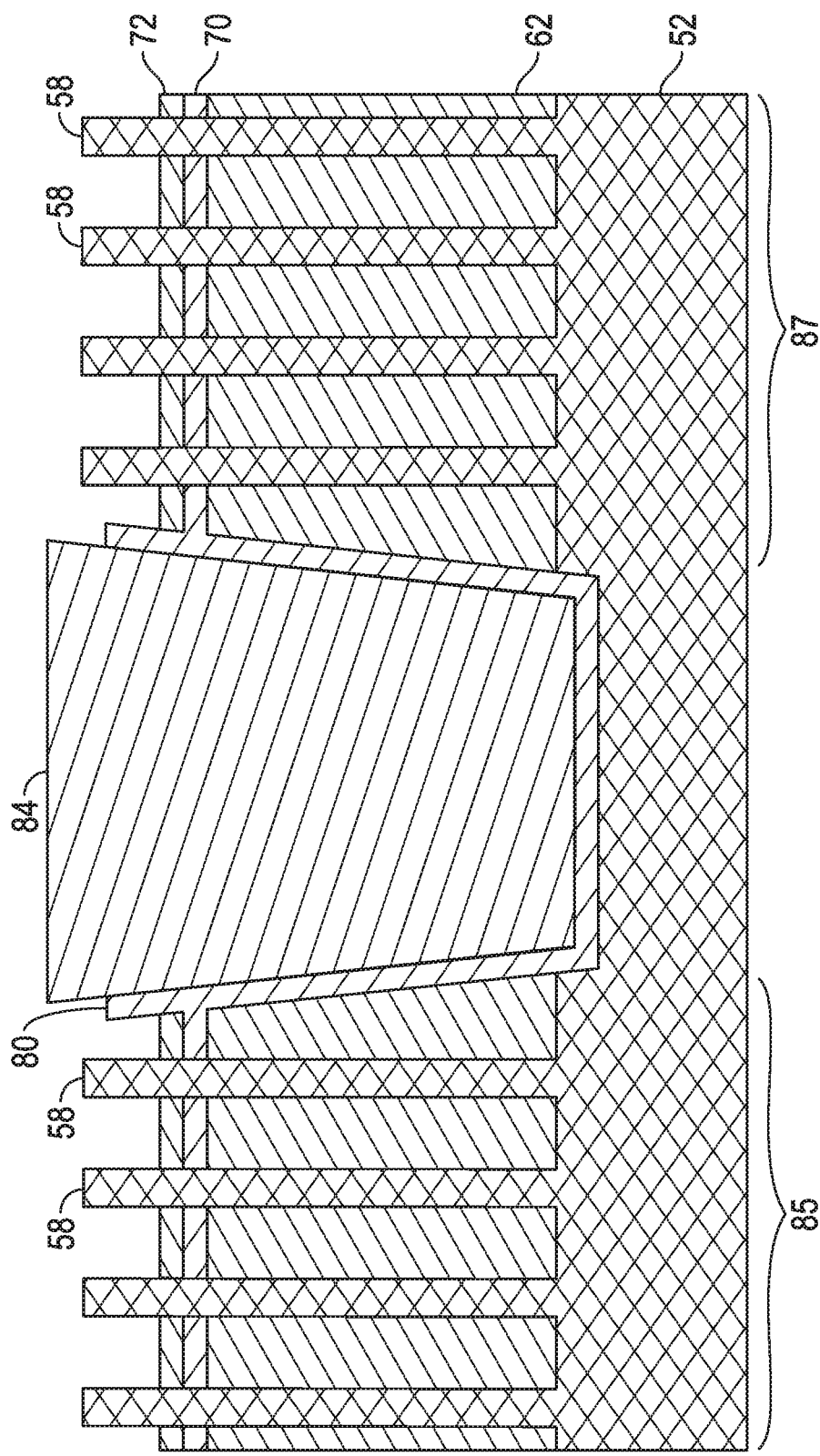
Figure 14:
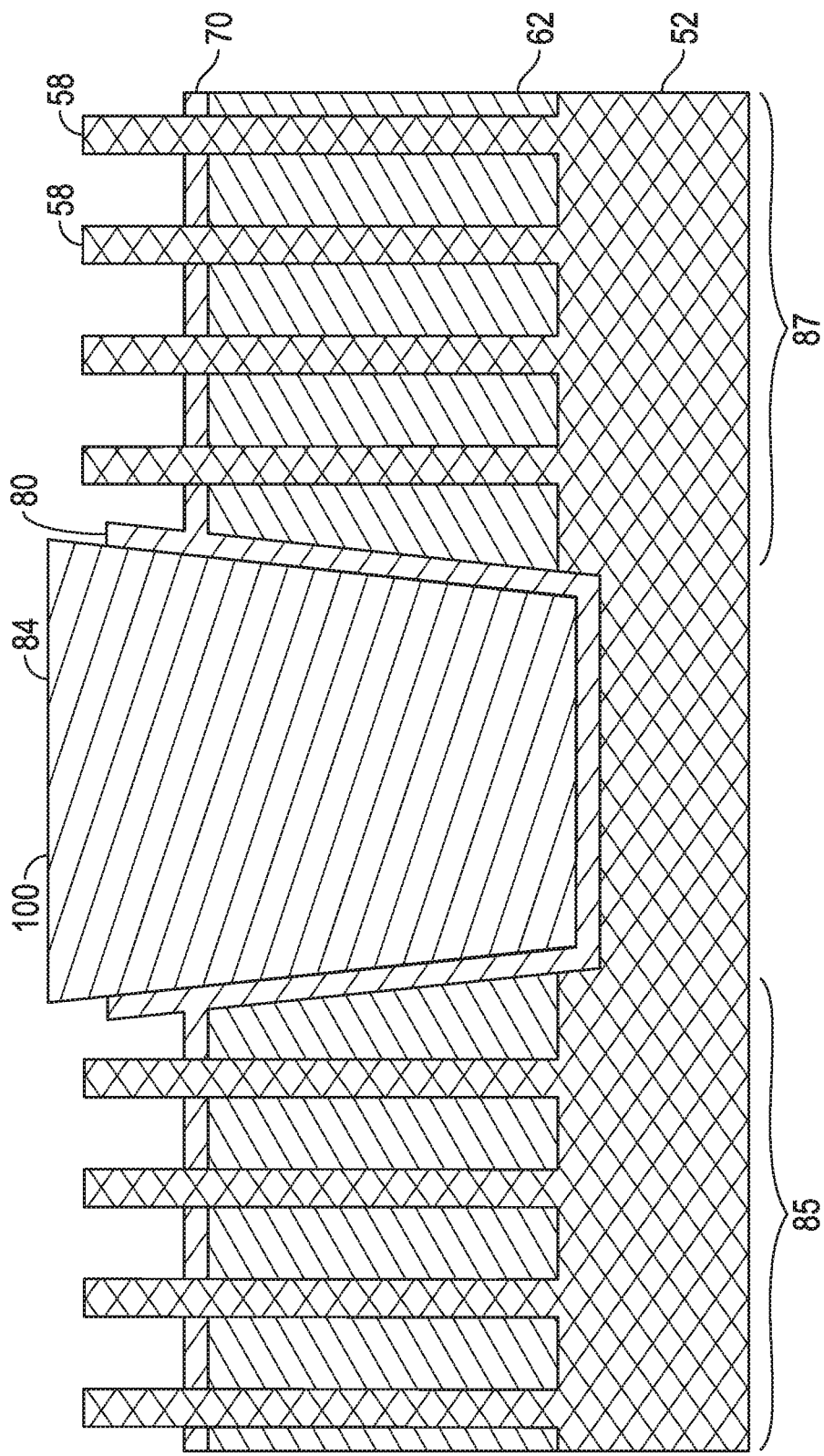
Figure 15:
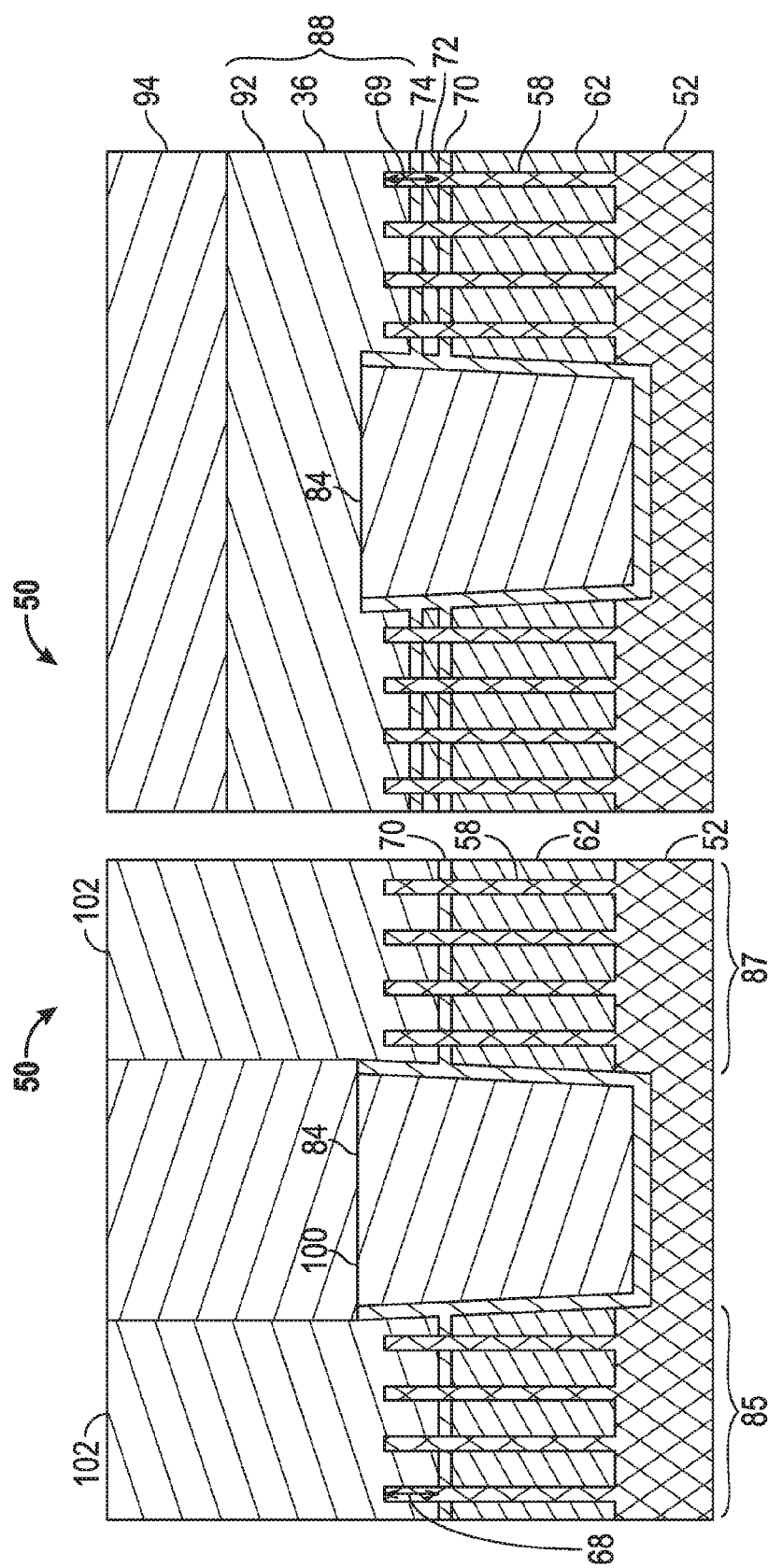

The following method steps of FIGS. 13-15 will be illustrated along axis X-X'. The method of fabricating FinFET IC 50 continues with the formation of a silicon nitride spacer on the sidewalls of the gate stack, as is known in the art. The silicon nitride spacer is formed by the deposition of a silicon nitride layer followed by the reactive ion etching (RIE) of the silicon nitride layer to form silicon nitride spacers on the sidewalls of the gate stack. During RIE, the etch stop layer 74 not underlying the gate stack 88 also is removed, as illustrated in FIG. 13. Next, in preparation for epitaxial growth, an epitaxial pre-clean process is performed. The epitaxial pre-clean process uses, for example, a diluted hydrofluoric acid etchant. The diluted hydrofluoric etchant removes the flowable oxide 72, as illustrated in FIG. 14. As the flowable oxide 72 has an etch rate when subjected to diluted hydrofluoric acid that is higher than the oxide of the STI 84 (such as, for example, HARP oxide), the STI is minimally affected, if at all, by the diluted hydrofluoric acid etchant. The final fin height is uniform because it is not affected by the gate etch, spacer etch and epitaxial pre-clean processes and is set by the etch stop layer. A silicon-comprising material then is epitaxially grown on the exposed portion of the fins 58. Suitable silicon-comprising materials include, for example, silicon germanium, such as for the formation of a PFET, and silicon or silicon carbide, such as for the formation of an NFET. After growth of the epitaxial silicon-comprising material, source and drain regions and contacts can be formed in the conventional manner (not shown) for gate first flow, or, alternatively, replacement gate and source/drain contact formation can be performed in a conventional manner if gate last flow is being executed.

FIG. 15 illustrates FinFET IC 50 along axis X-X' and Z-Z' after formation of the source and drain contacts. As illustrated, and as is different from the prior art, along the X-X' axis, one etch stop layer 70 overlies local isolation layer 62, while along the Z-Z' axis, two etch stop layers 70 and 74 overlie local isolation layer 62 and underlie the gate stack 88. Along the X-X' axis, the STI 84, has a surface 100 that is elevated above the etch stop layer 70 and even with or higher than fins 58. In this regard, lateral epitaxial growth of a silicon-comprising material on the fins 58 is precluded such that a short between active region 85 and active region 87 cannot occur. In addition, etch stop layer 70 maintains a uniform fin height 68 underlying source and drain contacts 102. Maintaining a uniform fin height 68 underlying the source and drain contacts 102 facilitates uniform epitaxial growth of the silicon-comprising material, which in turn allows for controllable contact resistance uniformity. Along the Z-Z' axis, the etch stop layer 74 maintains a uniform fin height, indicated by double-headed arrows 69, which is not affected by dilute hydrofluoric acid wet etch processing when removal of dummy oxide is performed for replacement gate flow, that allows for a uniform channel length across the fins underlying the gate stack 88.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method for fabricating a FINFET integrated circuit, the method comprising the steps of:
    etching a bulk semiconductor substrate of a first silicon-comprising material using an etch mask to form a plurality of fins;
    forming a first oxide between the plurality of fins, the first oxide having a height measured from the bulk semiconductor substrate less than a height of the plurality of fins measured from the bulk semiconductor substrate;
    depositing a first etch stop layer on the first oxide and overlying the plurality of fins;
    forming a second oxide on the first etch stop layer;
    depositing a second etch stop layer on the second oxide and overlying the plurality of fins;
    depositing a third oxide overlying the second etch stop layer;
    forming a shallow trench isolation that extends from at least a surface of the bulk semiconductor substrate to at least a surface of the second etch stop layer overlying the plurality of fins to form a first active region and a second active region;
    removing the second etch stop layer from the plurality of fins of the first active region and the second active region;
    removing the second oxide after removing the second etch stop layer;
    removing the first etch stop layer overlying the plurality of fins of the first active region and the second active region;
    removing the third oxide to expose the second etch stop layer overlying the second oxide of the first active region and the second active region; and
    forming a gate stack extending from the first active region to the second active region and overlying a portion of each of the plurality of fins.

2. The method of claim 1, further comprising epitaxially growing a second silicon-comprising material overlying the remaining portion of each of the plurality of fins.

3. The method of claim 1, wherein forming the first oxide comprises forming the first oxide using a flowable oxide.

4. The method of claim 1, wherein depositing the first etch stop layer comprises depositing a silicon nitride etch stop layer by gas cluster ion beam processing.

5. The method of claim 1, wherein depositing the first etch stop layer comprises depositing the first etch stop layer to a thickness in a range of about 3 to about 6 nanometers.

6. The method of claim 1, wherein forming the second oxide comprises forming the second oxide using a flowable oxide.

7. The method of claim 1, wherein forming the second oxide comprises forming the second oxide to have a thickness in a range of about 5 to about 10 nanometers.

8. The method of claim 1, wherein depositing the second etch stop layer comprises depositing a silicon nitride etch stop layer by gas cluster ion beam processing.

9. The method of claim 1, wherein depositing the second etch stop layer comprises depositing the second etch stop layer to a thickness in a range of about 3 to about 6 nanometers.

10. The method of claim 1, wherein forming the gate stack comprises forming a dummy gate stack comprising a dummy oxide and a dummy gate electrode.

11. The method of claim 1, wherein forming the gate stack comprises:
    depositing a gate insulator overlying the plurality of fins and the second oxide;
    depositing a gate electrode material overlying the gate insulator; and
    etching the gate electrode material and the gate insulator.

12. The method of claim 1, wherein forming the first oxide comprises:
    depositing a flowable oxide between and overlying the plurality of fins;
    removing a first portion of the flowable oxide by chemical mechanical planarization to expose the etch mask; and
    etching a second portion of the flowable oxide.

13. The method of claim 1, wherein forming the shallow trench isolation comprises:
    etching a trench through the third oxide, the second etch stop layer, the second oxide, the first etch stop layer, the etch mask, the plurality of fins, and the first oxide to at least a surface of the bulk semiconductor substrate;
    depositing a silicon nitride film within the trench;
    filling the trench with an oxide having an etch rate when subjected to an etchant that is lower than an etch rate of the third oxide when subjected to the same etchant.

14. A method for fabricating a FINFET integrated circuit, the method comprising the steps of:
    etching a bulk semiconductor substrate of a first silicon-comprising material to form a plurality of fins;
    forming a first oxide between the plurality of fins, the first oxide having a height measured from the bulk semiconductor substrate less than a height of the plurality of fins measured from the bulk semiconductor substrate;
    depositing a first etch stop layer on the first oxide;
    forming a second oxide on the first etch stop layer;
    depositing a second etch stop layer on the second oxide;
    forming a gate stack overlying a portion of each of the plurality of fins and a first portion of the second etch stop layer;
    removing a second portion of the second etch stop layer using reactive ion etching after forming the gate stack;
    cleaning a remaining portion of the plurality of fins and simultaneously removing the second oxide;
    epitaxially growing a second silicon-comprising material overlying the remaining portion of the plurality of fins; and
    forming contacts on the second silicon-comprising material.

15. The method of claim 14, wherein the first etch stop layer and the second etch stop layer are deposited overlying the plurality of fins and further comprising:
    depositing a third oxide on the second etch stop layer between and overlying the plurality of fins;
    etching a trench to at least a surface of the bulk semiconductor substrate;
    filling the trench with a fourth oxide having an etch rate that is less than an etch rate of the third oxide when exposed to the same etchant; and
    planarizing the fourth oxide to expose the second etch stop layer overlying the plurality of fins.

16. The method of claim 14, depositing the first etch stop layer comprises depositing a silicon nitride etch stop layer by gas cluster ion beam processing to a thickness in a range of about 3 to about 6 nanometers.

17. The method of claim 14, wherein removing a second portion of the second etch stop layer using reactive ion etching comprises removing the second portion of the second etch stop layer during a gate spacer formation process.

18. The method of claim 14, wherein forming the first oxide comprises:
- depositing a flowable oxide between and overlying the plurality of fins;
- removing a first portion of the flowable oxide by chemical mechanical planarization to expose an etch mask overlying the plurality of fins; and
- etching a second portion of the flowable oxide using a dilute hydrofluoric acid etchant.

* * * * *